(12) United States Patent
Taga

(10) Patent No.: US 6,817,071 B2
(45) Date of Patent: Nov. 16, 2004

(54) METHOD OF MANUFACTURING SURFACE ACOUSTIC WAVE DEVICE HAVING BUMP ELECTRODES

(75) Inventor: Shigeto Taga, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 23 days.

(21) Appl. No.: 10/026,811

(22) Filed: Dec. 27, 2001

(65) Prior Publication Data

US 2002/0089256 A1 Jul. 11, 2002

Related U.S. Application Data

(62) Division of application No. 09/546,899, filed on Apr. 10, 2000, now Pat. No. 6,369,490.

(30) Foreign Application Priority Data

Apr. 28, 1999 (JP) ............................................ 11-122508
Oct. 5, 1999 (JP) ............................................ 11-284260

(51) Int. Cl.⁷ .............................................. H04R 17/00
(52) U.S. Cl. ........................ 29/25.35; 29/594; 29/840; 29/843; 228/180.22; 310/363
(58) Field of Search ............................... 29/25.35, 594, 29/830, 840, 842–844; 228/1.1, 110.1, 190.22; 310/313 R, 363, 364

(56) References Cited

U.S. PATENT DOCUMENTS

| | | | | | |
|---|---|---|---|---|---|
| 4,692,653 A | * | 9/1987 | Kushida et al. | ............... | 310/334 |
| 5,108,950 A | * | 4/1992 | Wakabayashi et al. | ...... | 438/614 |
| 5,134,460 A | * | 7/1992 | Brady et al. | ................. | 257/737 |
| 5,699,027 A | * | 12/1997 | Tsuji et al. | ............. | 310/313 R |
| 5,991,989 A | * | 11/1999 | Onishi et al. | ............... | 29/25.35 |
| 6,028,011 A | * | 2/2000 | Takase et al. | ................ | 438/745 |

FOREIGN PATENT DOCUMENTS

| | | | |
|---|---|---|---|
| JP | 63-224344 | | 9/1988 |
| JP | 64-73638 | * | 1/1989 |

* cited by examiner

Primary Examiner—A. Dexter Tugbang
Assistant Examiner—Donghai D. Nguyen
(74) Attorney, Agent, or Firm—Keating & Bennett, LLP

(57) ABSTRACT

An electronic element includes a substrate with electrode pads provided thereon. Intermediate electrodes include base electrodes on the bottom surface of the intermediate electrodes, and the bottom surface of the intermediate electrodes are disposed on the electrode pads. Bump electrodes are provided on the intermediate electrodes and include a metal having a melting point of about 450° C. or more. Further, the base electrodes include a metallic material that can reduce orientation of the intermediate electrodes.

4 Claims, 4 Drawing Sheets

METHOD OF MANUFACTURING SURFACE ACOUSTIC WAVE DEVICE HAVING BUMP ELECTRODES

This application is a Divisional of U.S. patent application Ser. No. 09/546,899 filed Apr. 10, 2000, now U.S. Pat. No. 6,369,490.

BACKGROUND OF THE INVENTION

1. Field of the Invention

The present invention relates to a surface acoustic wave element having bump electrodes. More specifically, the present invention relates to a surface acoustic wave element having bump electrodes suitable for packaging while applying ultrasonic waves at joint portions thereof.

2. Description of the Related Art

In following recent trends toward miniaturization and thinning of electronic components, packaging of the electronic components via face-down bonding, where the functional surface of a surface acoustic wave element is packaged by arranging the functional surface so as to directly oppose to the packaging surface of a substrate, has been developed.

The general construction of the surface acoustic wave device packaged via face-down bonding is described with reference to FIG. 1 to FIG. 3. FIG. 1 shows a plan view of a surface acoustic wave element. FIG. 2 shows a cross section of the surface acoustic wave device in which the surface acoustic wave element is packaged. FIG. 3 shows an enlarged cross section of a package of the surface acoustic wave element in the area of a bump electrode. As shown in FIG. 1, the surface acoustic wave element 12 includes a piezoelectric substrate 21, a comb electrode 20 provided on the piezoelectric substrate 21, where the comb electrode 20 is made of a conductive thin film primarily including Al, a reflector electrode 19, an input electrode 16, an output electrode 17, and ground electrodes 18. Among these electrodes, the input electrode 16, the output electrode 17, and the ground electrodes 18 also function as electrode pads for supplying a high frequency voltage. Referring to FIG. 2, the bump electrodes 11 are provided on the electrode pads 16, 17 (not shown) and 18. The surface acoustic wave element is connected to a package electrode 13, which is provided on the package 14, via the bump electrodes 11.

The electrodes 16 to 20 provided on the piezoelectric substrate 21 are formed by patterning into a prescribed shape, via photolithography and etching, a metal thin film primarily made of Al having a thickness of about 0.1 to 0.2 $\mu$m, which is disposed on the substrate 21 by vacuum deposition or sputtering. Since these electrodes are simultaneously formed by vacuum deposition, the film thickness of the electrodes 16 to 18, or of the electrode pads, is determined by the film thickness of the comb electrode 20. In other words, when the comb electrode 20 is required to have a thickness of about 0.1 to 0.2 $\mu$m, the electrode pads 16 to 18 can not be formed to be thicker than the comb electrode. Accordingly, the electrode pads 16 to 18 are very weak. As such, when the bump electrodes 11 are directly formed on the electrode pads 16 to 18 having a thickness of 0.1 to 0.2 $\mu$m, and the surface acoustic wave element 12 is packaged on the package 14 via the bump electrodes 11, sufficient bonding strength cannot be obtained causing, for example, peel-off of the electrode pads 16 to 18.

As shown in FIG. 3, an intermediate electrode 22, which is also primarily made of Al, has a thickness of about 1 $\mu$m and is provided via vacuum deposition or sputtering on the electrode pads 16 to 18. Thus, sufficient bonding strength is achieved by providing an additional electrode layer on the electrode pads 16 to 18. However, the surfaces of the electrode pads 16 to 18 are easily oxidized since they are made mainly of Al. Consequently, bonding strength between the electrode pads 16 to 18 and the intermediate electrode 22 is insufficient if the intermediate electrode 22 is also made of Al, and if directly provided on the electrode pads 16 to 18 having oxidized surfaces. Accordingly, a base electrode 23 made of Ti, which has good bonding strength with Al is provided at the bottom surface of the intermediate electrode 22 to ensure sufficient bonding strength between the electrode pads 16 to 18 and the intermediate electrodes 22.

Accordingly, a thin layer made of Ti as the base electrode 23 is provided on the electrode pads 16 to 18, an Al layer serves as the intermediate electrode 22, the bump electrode 11 is provided on the intermediate electrode 22, and the surface acoustic wave element is disposed at a position where the package electrode 13 is opposed to the bump electrode 11. These components are packaged on the package 14 by press-bonding while applying ultrasonic waves or heat.

However, the conventional surface acoustic wave element as described above has the following problems. When the surface acoustic wave element 21 is arranged to be opposed to the package electrode 13 provided on the package 14 via the bump electrode 11, and the package electrode 13 is press-bonded to the package electrode 13 while applying ultrasonic waves or heat, the joining portion of the bump electrode 11 of the surface acoustic wave element, or the electrode pads 16 to 18 and the intermediate electrode 22 located thereon, suffers from large stresses. Since bonding strength between the electrode pads 16 to 18 and the intermediate electrode 22 is enhanced by providing the base electrode 23 such as Ti having a high bonding strength with Al at the bottom of the intermediate electrode 22, the stress generated in bonding the package electrode 13 to the bump electrode 11 becomes concentrated on the piezoelectric substrate 21 at the bottom of the electrode pads 16 to 18, not at the joint portion between the electrode pads 16 to 18 and the intermediate electrode 22. Consequently, cracks and breakage are caused on the piezoelectric substrate 21, which cause breakage of elements, decreased bond strength between the elements and the package 14, and breakdown of electrical continuity.

SUMMARY OF THE INVENTION

To overcome the problems described above, preferred embodiments of the present invention provide an apparatus and method of manufacturing a surface acoustic wave element that does not have the problems of breakage of elements, decreased bond strength between the elements and the package, or breakdown of electrical continuity when the surface acoustic wave element is arranged opposite to the package electrode while applying ultrasonic waves or heat.

In a preferred embodiment of the present invention, an electronic element includes a substrate with an electrode pad thereon, a base electrode provided on the electrode pad, an intermediate electrode provided on the base electrode, and a bump electrode provided on the intermediate electrode, wherein the base electrode includes a metallic material that reduces orientation of the intermediate electrode.

In another preferred embodiment of the present invention, a surface acoustic wave element includes a piezoelectric substrate, a comb electrode on the piezoelectric substrate, electrode pads on the piezoelectric substrate, base electrodes provided on the electrode pads, intermediate electrodes provided on the base electrodes, bump electrodes provided on the intermediate electrodes, wherein the bump electrodes are made of a metal having a melting point of about 450° C. or more. Further, the base electrodes include a metallic material that reduces orientation of the intermediate electrodes.

In another preferred embodiment of the present invention, a method of packaging an electronic element includes the steps of providing a piezoelectric substrate, forming electrode pads on the piezoelectric substrate, disposing base electrodes on the electrode pads, disposing intermediate electrodes on the base electrodes, forming bump electrodes on the intermediate electrodes, wherein the bump electrodes are made of a metal having a melting point of about 450° C. or more, and disposing the electronic element on a package such that a bump electrode opposes a package electrode and press-bonding the package electrode to the bump electrode while applying ultrasonic waves or heat. Further, the base electrodes include a metallic material that reduces orientation of the intermediate electrodes.

According to preferred embodiments of the present invention, the base electrode such as NiCr is provided at the bottom of the intermediate electrode in order to reduce orientation of Al or an alloy containing Al that constitutes the intermediate electrode. When the surface acoustic wave element is arranged opposite to a package electrode on the package via the bump electrode, and when the element is press-bonded while applying ultrasonic waves or heat, the stress applied to the electrode pad and the substrate is dispersed since Al or an alloy containing Al in the intermediate electrode has a low degree of orientation. Thus, the substrate does not generate cracks and breakage.

Other features, elements and advantages of the present invention will be described in detail below with reference to preferred embodiments of the present invention and the attached drawings.

BRIEF DESCRIPTION OF THE ATTACHED DRAWINGS

The present invention will become more fully understood from the detailed description given herein below and the accompanying drawings which are given by way of illustration only, and thus do not limit the present invention and wherein.

DETAILED DESCRIPTION OF PREFERRED EMBODIMENTS

Figure 1:
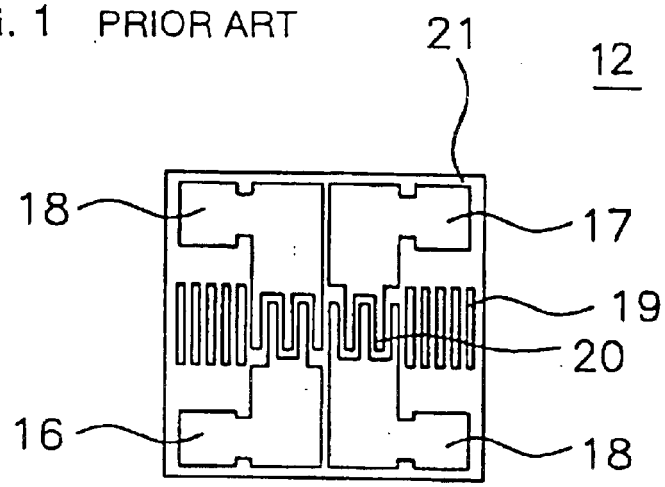
FIG. 1 shows a plan view of a conventional surface acoustic wave element.
Figure 2:
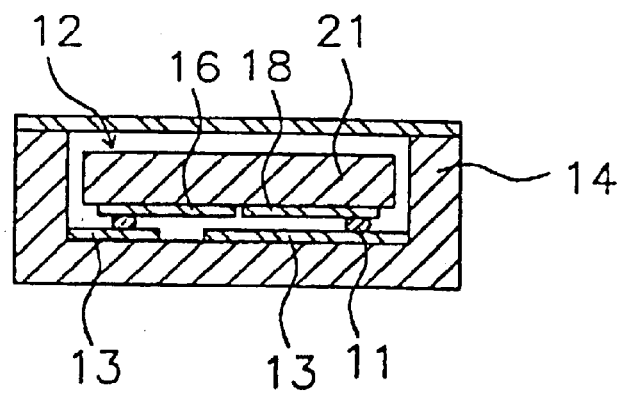
FIG. 2 is a cross section of a surface acoustic wave device in a conventional package.
Figure 3:
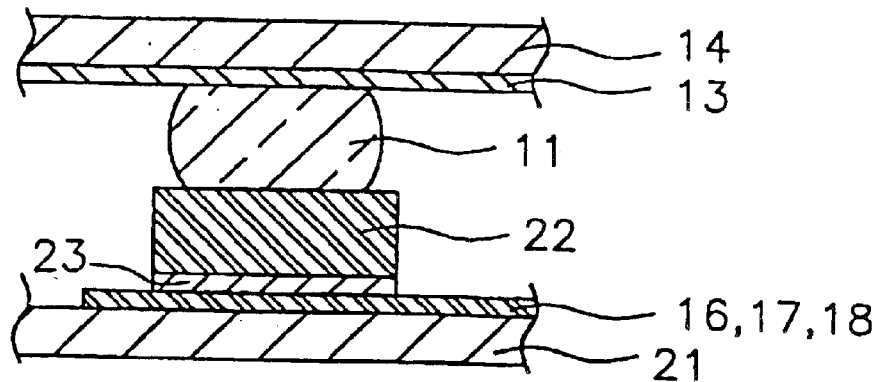
FIG. 3 shows an enlarged cross section in an area of a bump electrode of the conventional package having the surface acoustic wave device.

An electronic element according to one preferred embodiment of the present invention includes a substrate, electrode pads located on the substrate, intermediate electrodes provided on the electrode pads, and bump electrodes located on the intermediate electrodes. The electronic element also includes base electrodes provided on the bottom of the intermediate electrodes. Note that the metallic material of the base electrodes is arranged and constructed to reduce the orientation of the intermediate electrodes. With the above arrangement, the stress applied to the electrode pads and the piezoelectric substrate during packaging is minimized and dissipated so that cracks and breakage of the substrate do not occur.

The bump electrode is preferably made of a metal having a melting point of about 450° C. or more to eliminate solder bumps because soldering by applying heat cannot be used to prevent the substrate from being broken when press-bonding while applying ultrasonic waves or heat.

The electrode pad is preferably primarily made of Al or an alloy containing Al, and the base electrode preferably has a metallic material that can increase the half-width of the locking curve of the X-ray diffraction peak from the (111) plane of Al constituting the intermediate electrode to more than about 15 degrees. Preferably, the base electrodes are made of NiCr.

In one preferred embodiment, the electronic element is a surface acoustic wave element including a piezoelectric substrate. A comb electrode is provided on the surface of the piezoelectric substrate. Electrode pads are provided on the surface of the piezoelectric substrate, intermediate electrodes are provided on the electrode pads, and bump electrodes are made of a metal having a melting point of about 450° C. or more and provided on the intermediate electrodes. Since the surface acoustic wave element should be provided at the side where the space for allowing the surface wave to oscillate is formed by the comb electrode of the element, the element can not be bonded by filling an adhesive between the element and the package. Accordingly, the bump electrode should be arranged to achieve electrical continuity between the element and the package, and the mechanical connection between them. Therefore, high strength and reliability are particularly required for the bump electrodes.

The present invention also provides a method for packaging an electronic element or a surface acoustic wave element in a package including the steps of placing the electronic element or the surface acoustic wave element such that the bump electrodes are opposed to the package electrodes located on the package, and press-bonding the package electrode to the bump electrode via ultrasonic waves or heat. While the stress applied to the joint portion of the bump electrode increases by press-bonding, the stress applied to the piezoelectric substrate also increases. However, the stress applied to the electrode pads and the piezoelectric substrate is minimized and dissipated when base electrodes, which have a metallic material that reduces the orientation of the intermediate electrodes, are formed on the bottom of the intermediate electrode. With the method of preferred embodiments of the present invention, the substrate is prevented from cracking or breaking.

The electronic element or the surface acoustic wave element can be packaged as described above, and the electronic component or the surface acoustic wave device can be manufactured by sealing the package with a cap so as to be airtight.

Figure 4:
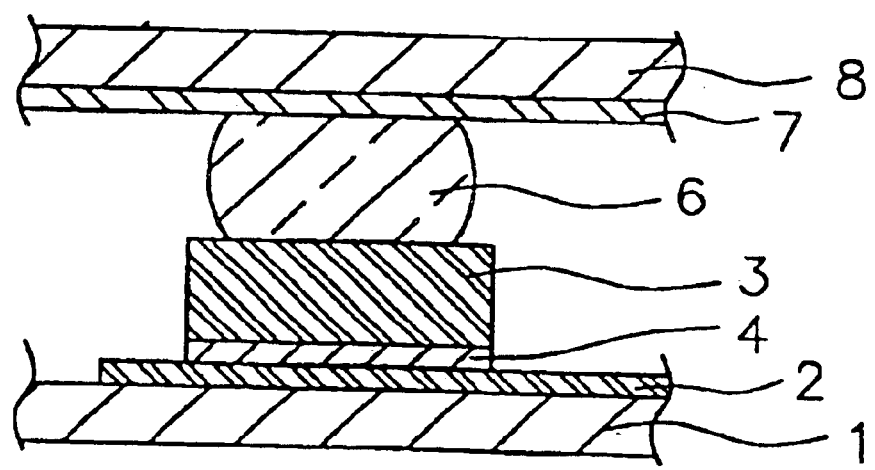
FIG. 4 shows an enlarged cross section in an area of the bump electrode of a package according to a preferred embodiment of the present invention.

FIG. 4 shows a cross section in an area of the bump electrode of a package according to another preferred embodiment of the present invention.

Referring to FIG. 4, the surface acoustic wave element according to a preferred embodiment of the present invention includes a piezoelectric substrate 1 preferably made of lithium tantalate, a comb electrode (not shown) made of an Al thin film having a thickness of about 0.1 to about 0.2 μm disposed on the surface of the piezoelectric substrate 1, and electrode pads 2 disposed on the same surface of the piezoelectric substrate 1 as the comb electrode, and such that the electrode pads are electrically connected to the comb electrode. Intermediate electrodes 3, which are made of Al, have a thickness of about 1 μm and are disposed on the electrode pads 2. Base electrodes 4, which are preferably made of NiCr, have a thickness of about 10 nm, and are provided at the bottom of the intermediate electrodes 3. Bump electrodes 6, which are preferably primarily made of Au, are provided on the intermediate electrodes 3.

A method of manufacturing a surface acoustic wave element according to another preferred embodiment of the present invention is described hereinafter. After forming a thin film of Al with a thickness of about 0.1 μm on the substrate 1 by vacuum deposition or sputtering, a comb electrode and electrode pads 2 are formed by patterning the thin film into a prescribed shape via photolithography and etching. Then, base electrodes 4, preferably including a NiCr film with a thickness of about 10 nm, are formed on the electrode pads 2 by vacuum deposition or sputtering using the photolithographic method. Then, intermediate electrodes 3 having a thickness of about 1 μm are formed on the base electrodes 4 by vacuum deposition or sputtering. The bump electrodes are formed on the intermediate electrodes 3 by a ball bonding method. More specifically, a ball formed at the tip of a Au wire is press-bonded onto the intermediate electrodes 3 while applying ultrasonic waves, and the bumps are formed by cutting the ball off the Au wire.

The surface of the surface acoustic wave element formed by the above steps is placed opposing package electrodes 7, which are formed on a package 8. The bump electrodes 6 are then press-bonded to the package electrode 7 by applying ultrasonic waves. A surface acoustic wave device is completed by sealing the package 8 with preferably an airtight cap (not shown).

Figure 5:
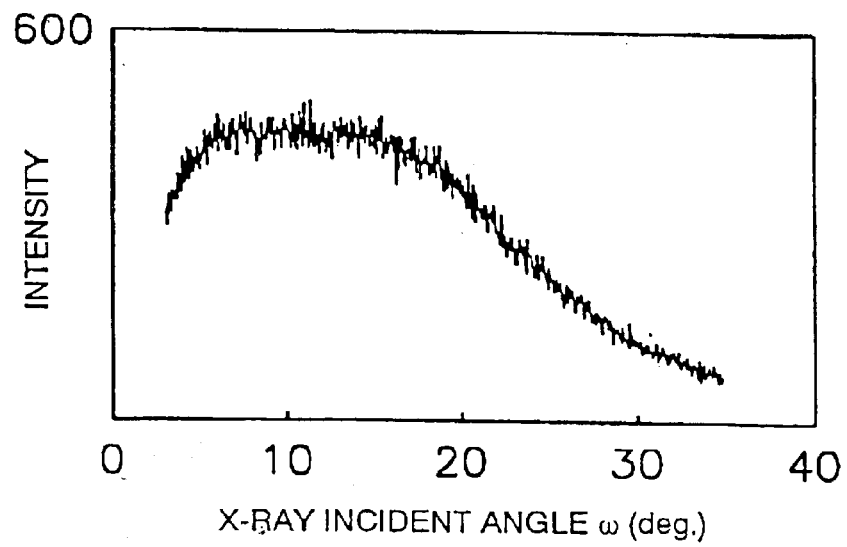
FIG. 5 shows the X-ray diffraction locking curve of the (111) plane of the intermediate electrode made of Al according to a preferred embodiment of the present invention.
Figure 6:
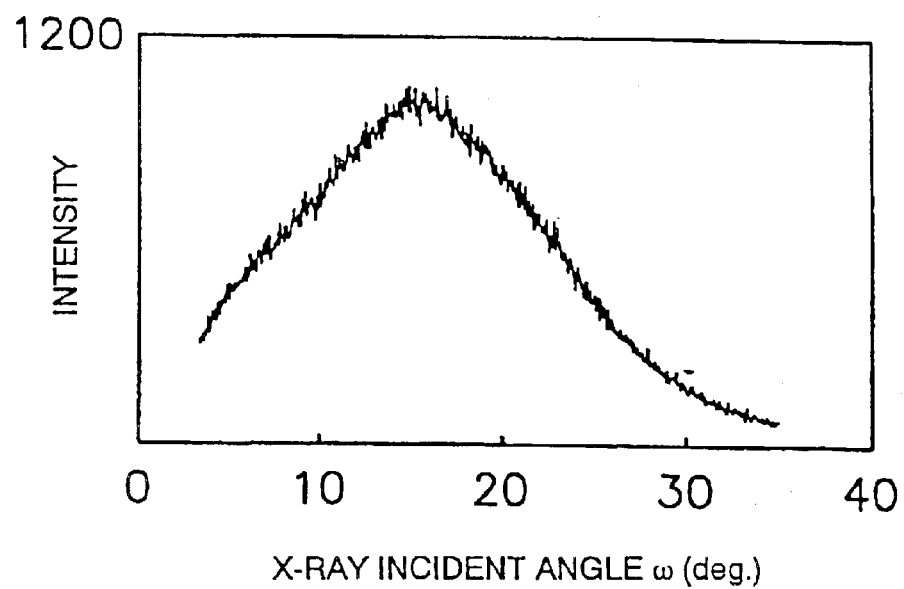
FIG. 6 shows the X-ray diffraction locking curve of the (111) plane of the intermediate electrode made of Al in the conventional surface acoustic wave device package.

FIG. 5 (example of present invention) and FIG. 6 (comparative example 1) show the results of measurements of X-ray diffraction locking curves from the (111) plane of Al of the intermediate electrode 3, wherein a NiCr layer (example of the present invention) or a Ti layer (comparative example 1) as the base electrode 4 is provided at the bottom of the intermediate electrode 3. As shown in the drawings, the half-width of the locking curve in the example of the present invention, in which the NiCr layer is provided at the bottom of the intermediate electrode, is about 20 degrees. This indicates that the orientation of Al is reduced as compared with the comparative example (the half-width of the locking curve is 15 degrees), which has the Ti layer on the bottom of the intermediate electrode. Providing the NiCr layer in place of the Ti layer as the base electrode 4 on the bottom of the intermediate electrode 3 allows orientation of the Al of the intermediate electrode 3 to be reduced.

Incidence of cracks on the substrate is shown in TABLE 1 with respect to each case when the NiCr layer (the present invention) or the Ti layer (comparative example 1) is provided as the base electrode 4 on the bottom of the intermediate electrode 3.

TABLE 1

|  | NiCr LAYER IS DISPOSED AT THE BOTTOM OF INTERMEDIATE LAYER (EXAMPLE OF PRESENT INVENTION) | Ti LAYER IS DISPOSED AT THE BOTTOM OF INTERMEDIATE LAYER (COMPARATIVE EXAMPLE 1) |
| --- | --- | --- |
| INCIDENCE OF CRACKS (NO. OF CRACKS/ SAMPLE NO.) | 0(%) (0/398) | 13(%) (60/467) |

As shown in TABLE 1, cracks that are generated in the comparative example 1 are not generated in preferred embodiments of the present invention. When orientation of Al of the intermediate electrode 3 is reduced by providing the base electrode 4 made of NiCr layer, or, in other words, when orientation of Al is reduced so that the half-width of the X-ray diffraction locking curve from the (111) plane of Al turns out to be about 15 degrees or more, the stress applied to the electrode pad 2 and substrate 11, when the package electrode 7 is press-bonded to the bump electrode 6 via ultrasonic waves, is minimized and dissipated. Thus, the problems due to cracks and breakage in the substrate 1 is greatly diminished.

In comparative example 2, orientation of Al in the intermediate electrode 3 is further enhanced. When a Ti layer with a thickness of about 5 nm is provided (comparative example 2) in the arrangement of comparative example 1, the half-width of the X-ray diffraction locking curve of the (111) plane of Al in the intermediate electrode 3 turns out to be about 2.45 degrees. This shows that orientation is further increased, thus, allowing the incidence of cracks in the substrate to increase up to 92%.

Figure 7:
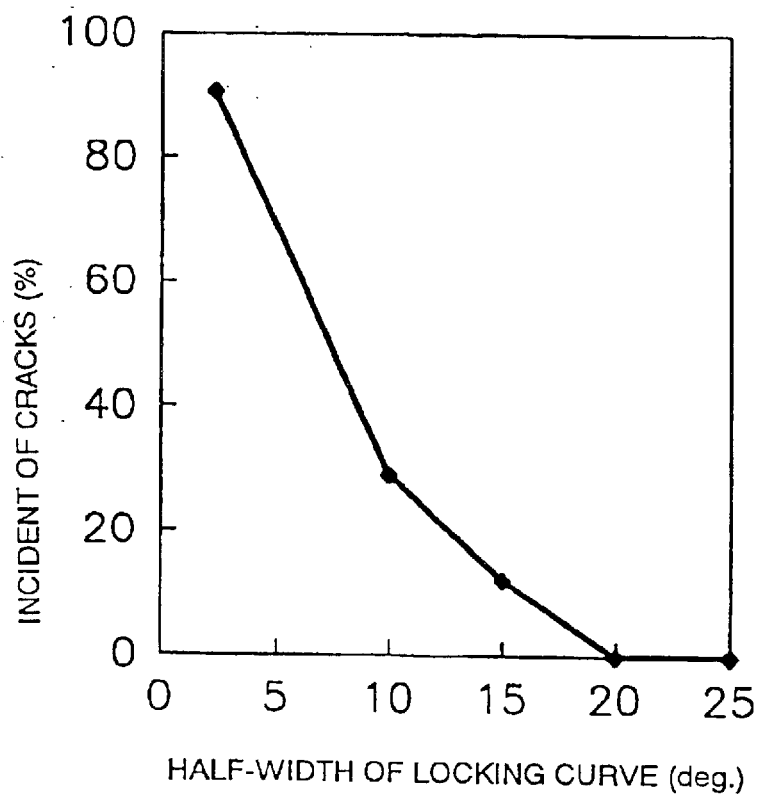
FIG. 7 is a graph showing the relationship between the half-width of the X-ray diffraction locking curve of the (111) plane of the intermediate electrode made of Al and the incidence of cracking in the substrate.

The relation between the half-width of the locking curve and the incidence of cracks was investigated from a different point of view. The results are shown in FIG. 7 together with the results in preferred embodiments of the present invention, and in the comparative examples 1 and 2. The results in FIG. 7 suggest that reducing the orientation of Al in the intermediate electrode 3 is correlative with decreasing the incidence of cracks in the substrate 1. It can be also concluded that, when orientation of Al is reduced so that the half-width of the locking curve is increased to about 15 degrees, the incidence of cracks in the substrate is sufficiently reduced.

While the example in which the electrode pad 2 and the intermediate electrode 3 are made of Al is shown in preferred embodiments of the present embodiment, the same effect can be obtained when these members are made of an alloy containing Al.

NiCr has a high bonding strength with Al, as does Ti, and so NiCr can greatly increase the bonding strength between the electrode pad 2 and the intermediate electrode 3. Note that the base electrode is not restricted to NiCr in the present invention, but that the metal preferably has the characteristic to reduce orientation of the metal in the intermediate electrode 3.

Figure 8:
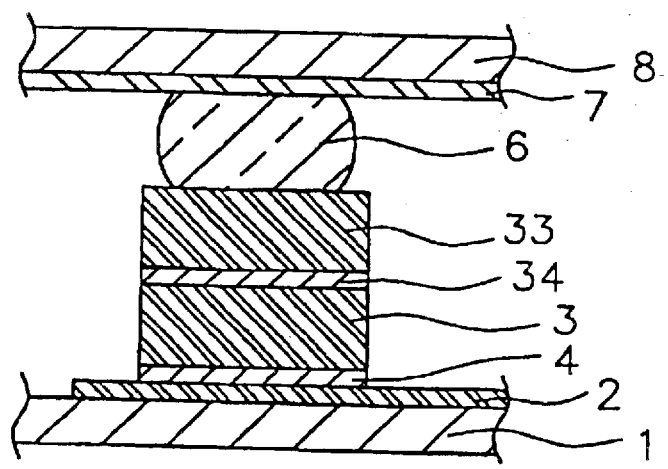
FIG. 8 in an enlarged cross section view at an area of the bump electrode of a package according to another preferred embodiment of the present invention.

While the intermediate electrode makes up one layer in the above-described preferred embodiments of the present embodiment, it may include two layers as shown in FIG. 8 or make up three or more layers, in order to ensure elevation of the intermediate electrode and to sufficiently reduce orientation of Al. Although the elements were packaged by press-bonding while applying ultrasonic waves, heat may be applied simultaneously with ultrasonic waves, or only heat may be applied for press-bonding.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing an electronic element, comprising the steps of:

providing a piezoelectric substrate;

forming electrode pads on the piezoelectric substrate;

disposing base electrodes on the electrode pads;

disposing intermediate electrodes on the base electrodes, such that the base electrodes are located between said electrode pads and said intermediate electrodes;

forming bump electrodes on the intermediate electrodes;

disposing the electronic element on a package having package electrodes such that said bump electrodes opposes said package electrodes; and press-bonding said package electrodes to said bump electrodes while applying ultrasonic waves or heat;

wherein said intermediate electrodes are made of at least one of Al and an alloy including Al; and said base electrodes include a metallic material that increases the half-width of a locking curve of an X-ray diffraction peak from a (111) plane of Al in said intermediate electrodes to greater than about 15 degrees.

2. The method of claim 1, further comprising sealing the package airtight with a cap.

3. The method of claim 1, further comprising providing additional intermediate electrodes having a plurality of layers, and disposing additional base electrodes between said layers of said intermediate electrodes.

4. The method of claim 1, wherein said bump electrodes are made of a metal having a melting point of about 450° C. or more.

* * * * *